United States Patent
Chang et al.

(10) Patent No.: US 12,015,104 B2
(45) Date of Patent: Jun. 18, 2024

(54) COMPOSITE REFLECTIVE STRUCTURE AND LIGHT-EMITTING DIODE CHIP AND LIGHT-EMITTING DIODE DEVICE INCLUDING THE SAME

(71) Applicant: XIAMEN SAN'AN OPTOELECTRONICS CO. LTD., Xiamen (CN)

(72) Inventors: Chung-Ying Chang, Xiamen (CN); Ji-Pu Wu, Xiamen (CN); Hongbin Tang, Xiamen (CN); Qihua Liao, Xiamen (CN); Yu-Tsai Teng, Xiamen (CN); Chia-Hao Chang, Xiamen (CN); Shutian Qiu, Xiamen (CN)

(73) Assignee: XIAMEN SAN'AN OPTOELECTRONICS CO., LTD., Xiamen (CN)

( * ) Notice: Subject to any disclaimer, the term of this patent is extended or adjusted under 35 U.S.C. 154(b) by 410 days.

(21) Appl. No.: 17/349,481

(22) Filed: Jun. 16, 2021

(65) Prior Publication Data

US 2021/0313488 A1    Oct. 7, 2021

Related U.S. Application Data

(63) Continuation-in-part of application No. PCT/CN2019/081782, filed on Apr. 8, 2019.

(51) Int. Cl.
*H01L 33/10*    (2010.01)
*H01L 33/32*    (2010.01)
*H01L 33/48*    (2010.01)
*H01L 33/54*    (2010.01)
*H01L 33/62*    (2010.01)

(52) U.S. Cl.
CPC .............. *H01L 33/10* (2013.01); *H01L 33/32* (2013.01); *H01L 33/486* (2013.01); *H01L 33/54* (2013.01); *H01L 33/62* (2013.01)

(58) Field of Classification Search
CPC ....... H01L 33/10; H01L 33/32; H01L 33/486; H01L 33/54; H01L 33/46
See application file for complete search history.

(56) References Cited

U.S. PATENT DOCUMENTS

2002/0008914 A1\*   1/2002   Tatsumi ............... G02B 5/0858
                                                    359/580

FOREIGN PATENT DOCUMENTS

CN        104160518 A     11/2014

OTHER PUBLICATIONS

Search Report issued to PCT application No. PCT/CN2019/081782 on Jan. 8, 2020.

\* cited by examiner

*Primary Examiner* — Syed I Gheyas
(74) *Attorney, Agent, or Firm* — Thomas | Horstemeyer, LLP

(57) ABSTRACT

A composite reflective structure includes at least one dielectric multilayer element which includes a first dielectric layer having a first refractive index, a second dielectric layer having a second refractive index, and a stress buffer layer interposed therebetween. The first refractive index is greater than the second refractive index. Also disclosed herein is a light-emitting diode chip including the abovementioned composite reflective structure and a light-emitting diode device including the light-emitting diode chip.

12 Claims, 3 Drawing Sheets

COMPOSITE REFLECTIVE STRUCTURE AND LIGHT-EMITTING DIODE CHIP AND LIGHT-EMITTING DIODE DEVICE INCLUDING THE SAME

CROSS-REFERENCE TO RELATED APPLICATION

This application is a bypass continuation-in-part (CIP) application of PCT International Application No. PCT/CN2019/081782, filed on Apr. 8, 2019. The entire content of the international patent application is incorporated herein by reference.

FIELD

The disclosure relates to a composite reflective structure which includes at least one dielectric multilayer element that includes a first dielectric layer, a second dielectric layer, and a stress buffer layer interposed therebetween.

BACKGROUND

Referring to FIG. 1, a conventional reflective structure adapted for a semiconductor device (such as light-emitting diode device) is a distributed Bragg reflector (DBR) which is formed by alternate stacking of first films 910 made of a low refractive index material and second films 920 made of a high refractive index material. Common materials suitable for making the first films 910 and/or the second films 920 might include silicon dioxide ($SiO_2$), titanium dioxide ($TiO_2$), niobium pentoxide ($Nb_2O_5$), tantalum pentoxide ($Ta_2O_5$), etc.

Generally, the first films 910 (e.g., $SiO_2$ films) and the second films 920 (e.g., $TiO_2$ films) of the DBR are formed by, e.g., a plating process that utilizes a high energy, which might be prone to generate a high stress therebetween, resulting in problems such as film peeling, film breaking and a high degree of roughness between the films. As such, undesired light scattering might occur and light extraction efficiency of the semiconductor device might be greatly reduced.

SUMMARY

Therefore, an object of the disclosure is to provide a composite reflective structure, a light-emitting diode chip and a light-emitting diode device that can alleviate at least one of the drawbacks of the prior art.

According to the disclosure, the composite reflective structure includes at least one dielectric multilayer element. The dielectric multilayer element includes a first dielectric layer having a first refractive index, a second dielectric layer having a second refractive index, and a stress buffer layer interposed therebetween. The first refractive index is greater than the second refractive index.

According to the disclosure, the light-emitting diode chip includes a light-emitting structure and the abovementioned composite reflective structure which is disposed on the light-emitting structure.

According to the disclosure, the light-emitting diode device includes a packaged body which includes leads and the light-emitting diode chip as mentioned above. The light-emitting diode chip is mounted in the packaged body, and is electrically connected to the leads.

BRIEF DESCRIPTION OF THE DRAWINGS

Other features and advantages of the disclosure will become apparent in the following detailed description of the embodiment(s) with reference to the accompanying drawings, of which.

DETAILED DESCRIPTION

Figure 1:
FIG. 1 is a sectional view illustrating a conventional distributed Bragg reflector (DBR)

Before the disclosure is described in greater detail, it should be noted that where considered appropriate, reference numerals or terminal portions of reference numerals have been repeated among the figures to indicate corresponding or analogous elements, which may optionally have similar characteristics.

Figure 2:
FIG. 2 is a sectional view illustrating an embodiment of a composite reflective structure according to the disclosure.

Referring to FIG. 2, an embodiment of a composite reflective structure 100 according to the disclosure includes at least one dielectric multilayer element.

For example, a plurality of (e.g., three) dielectric multilayer elements are shown in FIG. 2 for illustration purpose only. Each of the dielectric multilayer elements includes a first dielectric layer 110 having a first refractive index, a second dielectric layer 130 having a second refractive index, and a stress buffer layer 120 interposed therebetween. The first refractive index may be greater than the second refractive index.

A stress generated between the stress buffer layer 120 and the first dielectric layer 110 may be smaller than a stress generated between the first dielectric layer 110 and the second dielectric layer 130.

A stress generated between the stress buffer layer 120 and the second dielectric layer 130 may be smaller than a stress generated between the first dielectric layer 110 and the second dielectric layer 130.

The first dielectric layer 110 may include, but are not limited to, titanium dioxide, tantalum pentoxide, lead oxide, zinc sulfide, selenium oxide, and combinations thereof. In this embodiment, the first dielectric layer 110 is made of titanium dioxide ($TiO_2$) which has a first refractive index of approximately 2.4.

The second dielectric layer 130 may include, but are not limited to, silicon dioxide, magnesium fluoride, barium fluoride, calcium fluoride, thorium fluoride, and combinations thereof. In this embodiment, the second dielectric layer 130 is made of silicon dioxide ($SiO_2$) which has a second refractive index of approximately 1.5.

The stress buffer layer 120 may include, but are not limited to, at least two of the following materials: titanium dioxide, tantalum pentoxide, aluminium oxide and niobium pentoxide. For instance, the stress buffer layer 120 may include titanium dioxide and one of tantalum pentoxide, aluminium oxide, and niobium pentoxide ($Nb_2O_5$). In certain embodiments, the stress buffer layer (120) may be doped with dopants. The stress buffer layer 120 has a third refractive index which may be smaller than the first refractive index and greater than the second refractive index.

In this embodiment, the stress buffer layer 120 is made of titanium dioxide ($TiO_2$) and niobium pentoxide ($Nb_2O_5$) which have the third refractive index of approximately 2.3. The stress buffer layer 120 may be formed by one of plasma coating and ion beam-assisted deposition. In this embodiment, the stress buffer layer 120 is prepared by simultaneously coating titanium (Ti) and niobium (Nb), and then subjecting the mixture of Ti and Nb (in which Nb is present in an amount not greater than that of Ti) to oxidation. A stress generated between the stress buffer layer 120 and the first or second dielectric layer 110, 130 is smaller than a stress generated between the first dielectric layer 110 ($TiO_2$) and the second dielectric layer 130 ($SiO_2$) in the absence of the stress buffer layer 120.

With the stress buffer layer 120 having the refractive index between the first and second refractive indices, light incident at different incident angles on the composite reflective structure 100 of this disclosure can be effectively reflected and the stress generated in the composite reflective structure 100 can be greatly reduced.

Figure 3:
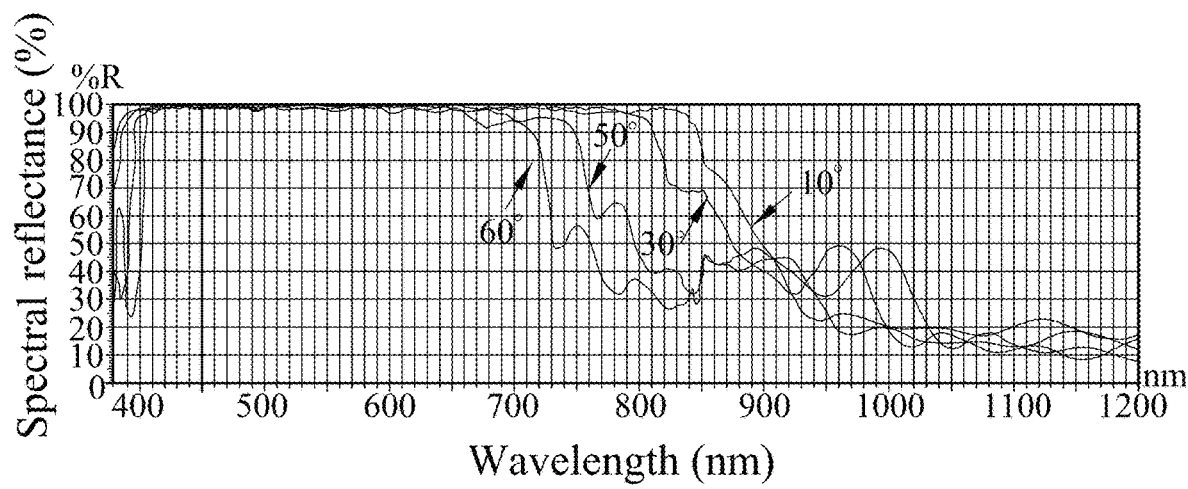
FIG. 3 is a graph illustrating spectral reflectance of the embodiment at different incident angles of light incident thereon.

The composite reflective structure 100 was coated on a glass plate, and then subjected to an optical property determination using a UV-VIS-NIR spectrophotometer (Hitachi High-Technologies Corporation, Model no.: UH4150). FIG. 3 shows the spectral reflectance of the composite reflective structure 100 at different incident angles (i.e., 10°, 30°, 50° and 60°) of light incident thereon. As shown in FIG. 3, the composite reflective structure 100 exhibits a reflectance of not lower than 98% when a light having a wavelength ranging from 400 nm to 700 nm is incident thereon at an incident angle ranging from 10° to 60°.

Figure 4:
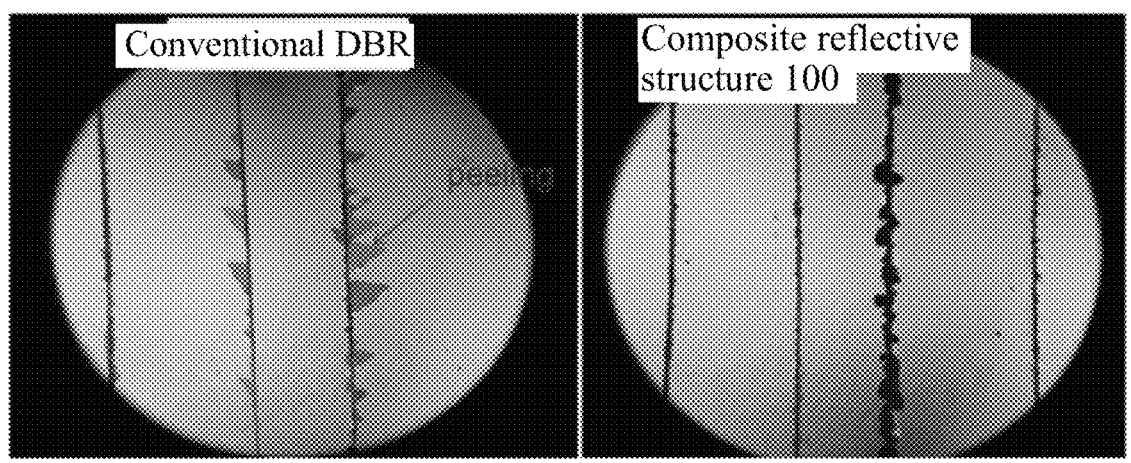
FIG. 4 shows two microscopic images of laser-cut surfaces of the conventional DBR of FIG. 1 (left panel) and the embodiment (right panel), respectively.

In addition, the composite reflective structure 100 coated on the glass plate was subjected to laser cutting to obtain a cut piece, which was then observed under microscope. In comparison, the conventional DBR without the stress buffer layer 120 (see FIG. 1) which serves as a control, was coated on a glass plate, and then subjected to the same experimental procedures. It can be seen from the left panel of FIG. 4 that the conventional DBR shows significant peeling after laser cutting due to greater internal stress generated between the two films 910, 920 made of different materials. In contrast, as shown in the right panel of FIG. 4, the composite reflective structure 100 having the stress buffer layer 120 formed therein does not have any obvious film peeling and shows a relatively smooth laser cutting surface, indicating that the stress buffer layer 120, formed between the first dielectric layer 110 and the second dielectric layer 130, is capable of greatly relieving and reducing the internal stress of the composite reflective structure 100.

Figure 5:
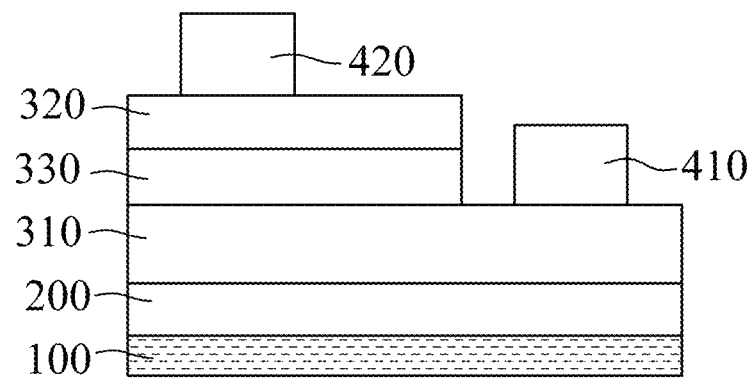
FIG. 5 is a sectional view illustrating an embodiment of a light-emitting diode chip according to the disclosure.

Referring to FIG. 5, the present disclosure also provides an embodiment of a light-emitting diode (LED) chip, which includes a light-emitting structure 300 and the composite reflective structure 100 as mentioned above that is disposed on the light-emitting structure 300. The LED chip may have any configuration well known to those skilled in the art.

In this embodiment, the LED chip is a face-up LED chip, but is not limited thereto. The face-up LED chip may further include a substrate 200, a first electrode 410, and a second electrode 420.

The substrate 200 is made of a material suitable for growing the light-emitting structure 300 that may be made of a gallium nitride-based semiconductor material. Examples of a material for making the substrate 200 may include, but are not limited to, sapphire and silicon carbide. In certain embodiments, the substrate 200 is patterned, for example, a patterned sapphire substrate (PSS).

The light-emitting structure 300 is disposed on the substrate 200. The light-emitting structure 300 may have a first semiconductor layer 310, a second semiconductor layer 320 and a light-emitting layer 330 disposed therebetween.

The first semiconductor layer 310 and the second semiconductor layer 320 are respectively doped with a first dopant and a second dopant that is opposite in conductivity to the first dopant. For instance, the first dopant may be an n-type dopant, and the second dopant may be a p-type dopant, and vice versa.

Each of the first semiconductor layer 310, the second semiconductor layer 320 and the light-emitting layer 330 may be made of a gallium nitride-based material, such as AlInGaN.

Each of the first semiconductor layer 310 and the second semiconductor layer 320 may be formed as a single layer structure, or a multi-layered structure.

The light-emitting layer 330 may be configured to emit light with a desirable wavelength (e.g., UV light or blue light wavelength). The light-emitting layer 330 may have a single-quantum well structure or a multi-quantum well structure.

Each of the first semiconductor layer 310, the second semiconductor layer 320 and the light-emitting layer 330 may be formed by a metal organic chemical vapor deposition (MOCVD) process or a molecular beam epitaxy (MBE) process. The light-emitting structure 300 may be subjected to photolithography by patterning certain area thereof so as to expose a portion of the first semiconductor layer 310. The first electrode 410 is disposed on and electrically connected to the exposed portion of the first semiconductor layer 310. The second electrode 420 is disposed on and electrically connected to the second semiconductor layer 320.

The composite reflective structure 100 is disposed on the substrate 200 opposite to the light-emitting structure 300 (i.e., opposite to a light-emitting surface of the light-emitting structure 300) so as to reflect a light emitted from the light-emitting layer 330 back to the light-emitting structure 300, thereby enhancing intensity of the light exiting out of the LED chip. In this embodiment, the composite reflective structure 100 is formed by e.g., a sputtering coating machine, and includes a plurality of dielectric multilayer elements.

It should be noted that the LED chip is not limited to the face-up LED chip where the composite reflective structure 100 is back-coated, but may also be a flip-chip LED chip where the composite reflective structure 100 is not back-coated, e.g., formed into a passivation layer (PV layer).

The LED chip of this disclosure was subjected to laser cutting, and then the number of the resultant LED dies with back side chipping is determined. In comparison, a comparative LED chip was prepared by procedures similar to those of the LED chip of this disclosure, except the composite reflective structure 100 was replaced with the conventional DBR shown in FIG. 1, which was disposed on the substrate 200 using an evaporation deposition coating machine (Model no. OTFC-1500) under a condition of mass production. The results are shown in Table 1 below.

TABLE 1

| Type of LED chip | Number of LED dies with back side chipping | Difference compared with the comparative LED chip | Percentage difference compared with the comparative LED chip (%) |
|---|---|---|---|
| The Comparative LED chip | 68.0 | — | — |
| The LED chip of this disclosure | 52.5 | −15.5 | −22.8 |

Note:
"—" indicates not applicable.

As shown in Table 1, as compared to the comparative LED chip, the amount of die chipping occurring in the LED chip of this disclosure is significantly reduced by 22.8%. This result indicates that the LED chip of this disclosure including the composite reflective structure 100 formed with the stress buffer layer 120 is effective in reducing die chipping during laser cutting, and thus can be adapted for large-scale production of LED dies.

Figure 6:
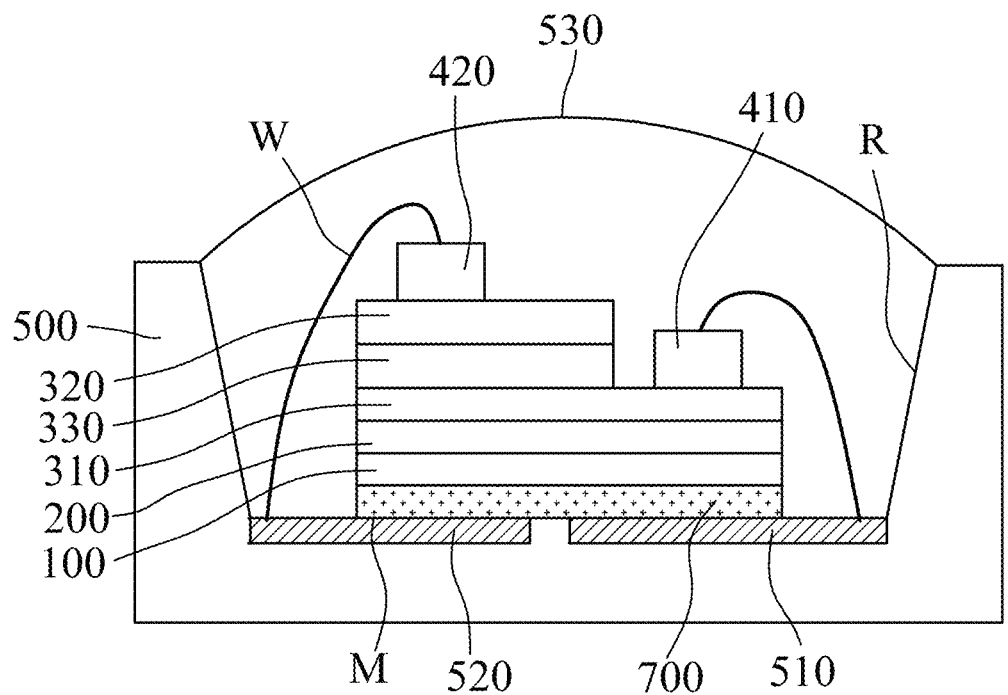
FIG. 6 is a sectional view illustrating an embodiment of a light-emitting diode device according to the disclosure.

Referring to FIG. 6, an embodiment of a light-emitting diode (LED) device according to the disclosure includes a packaged body 500 which includes leads 510 and 520, and the LED chip as mentioned above. The LED chip may be mounted in the packaged body 500, and may be electrically connected to the leads 510, 520.

The packaged body 500 may be made of a plastic resin, and may have a mounting surface (M) and a reflective surface (R) which reflects a light emitted from the LED chip. The leads 510 and 520 are disposed on the mounting surface (M). The LED chip is mounted on the mounting surface (M), and is electrically connected to the leads 510, 520 through bonding wires (W). The LED device may further include an adhesive layer 700 disposed between the mounting surface (M) and the LED chip to assist the adhesion between the packaged body 500 and the LED chip. The adhesive layer 700 may be formed by solidification of, e.g., silver epoxy resin. In addition, the LED device may further include a molded part 530 encapsulating the LED chip. The molded part 530 may be made from a fluorescent glue.

In conclusion, by disposing the stress buffer layer 120 between the first and second dielectric layers 110, 130 to reduce the stress generated therebetween, the composite reflective structure 100 of this disclosure is conferred with a reduced internal stress, and thus, the problems of film peeling and film breaking occurring in the conventional DBR can be avoided.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A composite reflective structure, comprising:
   at least one dielectric multilayer element which includes a first dielectric layer having a first refractive index, a second dielectric layer having a second refractive index, and a stress buffer layer interposed between said first dielectric layer and said second dielectric layer, said first refractive index being greater than said second refractive index,
   wherein said stress buffer layer includes at least two materials selected from the group consisting of titanium dioxide, tantalum pentoxide, aluminium oxide and niobium pentoxide.

2. The composite reflective structure of claim 1, wherein a stress generated between said stress buffer layer and said first dielectric layer is smaller than a stress generated between said first dielectric layer and said second dielectric layer.

3. The composite reflective structure of claim 1, wherein a stress generated between said stress buffer layer and said second dielectric layer is smaller than a stress generated between said first dielectric layer and said second dielectric layer.

4. The composite reflective structure of claim 1, wherein said first dielectric layer includes a material selected from the group consisting of titanium dioxide, tantalum pentoxide, lead oxide, zinc sulfide, selenium oxide, and combinations thereof.

5. The composite reflective structure of claim 1, wherein said second dielectric layer includes a material selected from the group consisting of silicon dioxide, magnesium fluoride, barium fluoride, calcium fluoride, thorium fluoride, and combinations thereof.

6. The composite reflective structure of claim 1, wherein said stress buffer layer includes titanium dioxide and one of tantalum pentoxide, aluminium oxide and niobium pentoxide.

7. The composite reflective structure of claim 1, wherein said stress buffer layer has a third refractive index which is smaller than said first refractive index, and which is greater than said second refractive index.

8. The composite reflective structure of claim 1, wherein said stress buffer layer is formed by one of plasma coating and ion beam-assisted deposition.

9. The composite reflective structure of claim 1, comprising a plurality of said dielectric multilayer element.

10. A light-emitting diode chip, comprising a light-emitting structure, and a composite reflective structure as claimed in claim 1 which is disposed on said light-emitting structure.

11. The light-emitting diode chip of claim 10, wherein said light-emitting structure is made of a gallium nitride-based material.

12. A light-emitting diode device, comprising a packaged body which includes leads, and a light-emitting diode chip as claimed in claim 10 which is mounted in said packaged body and which is electrically connected to said leads.

\* \* \* \* \*